United States Patent
Kido et al.

(10) Patent No.: US 6,632,544 B1
(45) Date of Patent: Oct. 14, 2003

(54) AROMATIC AMINE DERIVATIVE, SOLUBLE CONDUCTIVE COMPOUND, AND ELECTROLUMINSCENT ELEMENT

(75) Inventors: Junji Kido, 4-3, Umamikita 9-chrome, Kitakatsuragi-gun, Koryo-cho, Nara, 635-0831 (JP); Hiroyoshi Fukuro, Funabashi (JP); Hitoshi Furusho, Funabashi (JP); Tomoyuki Enomoto, Funabashi (JP)

(73) Assignees: Junji Kido, Koryo-cho (JP); Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 09/914,076
(22) PCT Filed: Feb. 22, 2000
(86) PCT No.: PCT/JP00/00999
§ 371 (c)(1), (2), (4) Date: Aug. 23, 2001
(87) PCT Pub. No.: WO00/50490
PCT Pub. Date: Aug. 31, 2000

(30) Foreign Application Priority Data

Feb. 23, 1999 (JP) ............................................. 11-044078

(51) Int. Cl.[7] ................... B32B 19/00; B32B 9/00; H01J 1/62; H01J 63/04; C09K 11/06
(52) U.S. Cl. ................... 428/690; 428/917; 313/503; 313/506; 252/301.16
(58) Field of Search ................... 428/917, 690; 252/301.16, 500, 519.33; 313/503, 506; 257/40

(56) References Cited

U.S. PATENT DOCUMENTS 3,172,862 A  3/1965  Gurnee et al. ............ 252/301.3

(List continued on next page.)

FOREIGN PATENT DOCUMENTS

| EP | A2-827367 | 3/1998 |
| JP | A5-135878 | 6/1993 |
| JP | A6-316631 | 11/1994 |
| JP | A10-101625 | 4/1998 |
| JP | 2000-204158 | * 7/2000 |
| WO | WO 92/22911 | 12/1992 |

OTHER PUBLICATIONS

Choi, H.J. et al., "Electrorheological characteristics of semi-conducting poly(aniline–co–o–ethoxyaniline) suspension", Polymer, Elsevier Sceince Publishers B.V, GB, vol. 40, No. 8, Apr. 1999, pp. 2163–2166.

(List continued on next page.)

Primary Examiner—Cynthia H. Kelly
Assistant Examiner—Camie S Thompson
(74) Attorney, Agent, or Firm—Birch, Stewart, Kolasch & Birch, LLP

(57) ABSTRACT

An aromatic amine derivative of the following general formula (1) is useful to form an auxiliary carrier transporting layer in an electroluminescent device.

$$-[A-NH]_n- -[B-N(R^1)]_m-  \quad (1)$$

$R^1$ is a monovalent hydrocarbon group or organooxy group, and A and B have the following general formula (2) or (3).

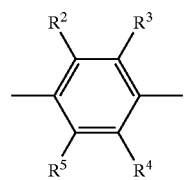

(2)

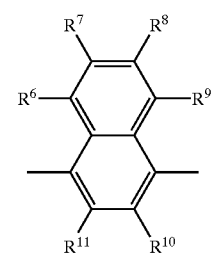

(3)

16 Claims, 1 Drawing Sheet

U.S. PATENT DOCUMENTS

| | | | | |
|---|---|---|---|---|
| 3,710,167 | A | | 1/1973 | Dresner et al. .............. 313/108 |
| 4,356,429 | A | | 10/1982 | Tang ........................... 313/563 |
| 5,232,631 | A | | 8/1993 | Cao et al. |
| 5,317,169 | A | * | 5/1994 | Nakano et al. ................ 257/40 |
| 5,456,862 | A | | 10/1995 | Kwan-Yue et al. |
| 5,719,467 | A | * | 2/1998 | Antoniadis et al. .......... 313/506 |
| 5,748,271 | A | * | 5/1998 | Hikmet et al. ................. 349/69 |
| 5,795,942 | A | * | 8/1998 | Rhee et al. ................... 525/540 |
| 5,932,144 | A | * | 8/1999 | Shimizu et al. .............. 252/500 |
| 6,403,236 | B1 | * | 6/2002 | Ohnishi et al. .............. 428/690 |

OTHER PUBLICATIONS

Chapman, S.E., "Preparation and characterisation of N–substituted aniline with aniline", Synthetic Metals, vol. 55, 1993, pp. 995–998.

Pope et al., *J. Chem. Phys.*, 38, *Letters to the Editor*, Physics Department, New York University, New York, *Electroluminescence in Organic Crystals*, pp. 2042–2043 (1963).

Helfrich et al., *Physical Review Letters*, vol. 14, No. 7, pp. 229–231 (Feb. 15, 1965).

Helfrich et al., *The Journal of Chemical Physics*, vol. 44, No. 8, pp. 2902–2908 (Apr. 15, 1966).

Schadt et al., *The Journal of Chemical Physics*, vol. 50, No. 10, pp. 4364–4368 (May 15, 1969).

Partridge, *Polymer*, vol. 24, pp. 748–754 (Jun. 1983).

Hayashi et al., *Japanese Journal of Applied Physics*, vol. 25, No. 9, pp. L773–L775 (Sep. 1986).

Tang et al., *Appl. Phys. Lett.*, vol. 51, No. 12, pp. 913–915 (Sep. 21, 1987).

Adachi et al., *Japanese Journal of Applied Physics*, vol. 27, No. 2, pp. L269–L271 (Feb. 1988).

Adachi et al. *Japanese Journal of Applied Physics*, vol. 27, No. 4, pp. L713–L715 (Apr. 1988).

* cited by examiner

AROMATIC AMINE DERIVATIVE, SOLUBLE CONDUCTIVE COMPOUND, AND ELECTROLUMINSCENT ELEMENT

This application is the national phase under 35 U.S.C. §371 of PCT International Application No. PCT/JP00/00999 which has an International filing date of Feb. 22, 2000 which designated the United States of America, the entire contents of which are hereby incorporated by reference.

TECHNICAL FIELD

This invention relates to novel aromatic amine derivatives and soluble, electrically conductive compounds in which the aromatic amine derivatives form salts with electron accepting dopants, and which are useful in antistatic coatings and electromagnetic shields because of high solubility.

The invention also relates to an electroluminescent device comprising at least one electroluminescent organic layer including a light emitting material layer interposed between an anode and a cathode, wherein the light emitting material layer emits light upon application of a voltage between the anode and the cathode.

BACKGROUND ART

Several approaches were attempted in the art for making antistatic or low resistive materials. Exemplary approaches include admixing of metal powder or conductive metal oxide in particular non-conductive polymers and use of ionic surfactants.

These approaches, however, afford several issues, for example, failure to form uniform coatings, loss of transparency, and the presence of more ionic impurities which precludes use in electronic devices.

On the other hand, low resistive polymeric materials include electrically conductive polymers as typified by polyanilines, polypyrroles and polythiophenes. These conductive polymers are obtainable by using an aniline, pyrrole, thiophene or a derivative thereof as a starting monomer, and effecting chemical oxidative polymerization with an oxidizing agent or electrochemical polymerization. Conductive polymeric materials obtained by such processes are generally known to exhibit high electric conductivity when doped with acids such as Lewis acids. The conductive polymers thus obtained can be used as antistatic agents, electromagnetic shields or the like.

However, since the conductive polymeric materials polymerized by the above processes are generally less soluble in solvents, varnishes of the polymeric materials dissolved or dispersed in organic solvents afford films which are brittle and low in mechanical strength. It is thus difficult to obtain tough coatings.

Specifically, the conductive polymers, due to their low resistance, have an improved antistatic effect on practical use and are improved in such capability as charge accumulation. However, they are not necessarily satisfactory with respect to solubility in solution and coating properties. Low solubility often raises a problem of shaping. There is a need for polymers which are more soluble in organic solvents and exhibit high electric conductivity while maintaining various characteristics inherent to conventional conductive polymers.

Recently, engineers are interested in conductive polymers as a carrier transporting material in electroluminescent devices. At the first onset, the electroluminescent phenomenon of organic material was observed on anthracene single crystals (J. Chem. Phys., 38 (1963), 2042). Thereafter, a relatively intense luminescent phenomenon was observed using a solution electrode having high injection efficiency (Phys. Rec. Lett., 14 (1965), 229). Thereafter, active research works were made on organic luminescent materials between conjugated organic host materials and conjugated organic activators having a fused benzene ring (U.S. Pat. No. 3,172,862, U.S. Pat. No. 3,710,167, J. Chem. Phys., 44 (1966), 2902 and J. Chem. Phys., 50 (1969), 4364). The organic luminescent materials listed herein, however, suffer from the drawbacks of increased film thickness and a high electric field needed to induce luminesence.

As one countermeasure, researches were made on thin-film devices using evaporation technique and succeeded in lowering drive voltage. Such devices, however, failed to provide luminance at a practically acceptable level (Polymer, 24 (1983), 748, and Jpn. J. Appl. Phys., 25 (1986), L773).

Recently, Eastman Kodak proposed a device in which a charge transporting layer and a light emitting layer are formed between electrodes by an evaporation technique, accomplishing a high luminance at a low drive voltage (Appl. Phys. Lett., 51 (1987), 913 and U.S. Pat. No. 4,356, 429). Thereafter, research works were further activated, as by shifting to three layer type devices in which carrier transporting and light emitting functions are separated. From then onward, the study on organic electroluminescent devices entered the practical stage (Jpn. J. Appl. Phys., 27 (1988), L269, L713).

However, there remains a serious problem of product lifetime as demonstrated by a luminescent life which is 3,000 hours at the shortest and several ten thousands of hours at the longest when operated at several hundreds of candelas.

DISCLOSURE OF THE INVENTION

A first object of the invention is to provide a soluble, conductive compound which is highly dissolvable in solution, effectively applicable, stable in solution form, and capable of forming a conductive polymeric film or coating which is antistatic or minimized in charge accumulation, and an aromatic amine derivative as a starting material therefor.

A second object of the invention is to provide an organic electroluminescent device using an auxiliary carrier transporting layer-forming material which is effectively applicable, in order that the device be improved in durability.

To attain the above objects, the invention provides an aromatic amine derivative comprising recurring units of the following general formula (1) and having a number average molecular weight of 250 to 100,000.

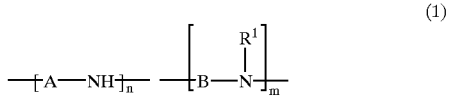

(1)

Herein $R^1$ is a substituted or unsubstituted monovalent hydrocarbon group or organooxy group; A and B each are independently a divalent group of the following general formula (2) or (3):

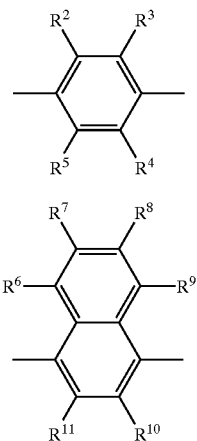

(2)

(3)

wherein $R^2$ to $R^{11}$ each are independently hydrogen, a hydroxyl group, substituted or unsubstituted monovalent hydrocarbon group, organooxy group, acyl group or sulfonate group; m and n each are independently a positive number of at least 1, and the sum of m+n is 3 to 3,000.

The invention also provides a soluble, electrically conductive compound in which the aromatic amine derivative forms a salt with an electron accepting dopant.

The aromatic amine polymer of the invention is an organic solvent-soluble, conductive, high molecular weight compound obtained by using inexpensive aniline derivatives as starting material and effecting oxidative polymerization thereof. It is useful as a coating on various electronic devices. It is also useful as a light emitting material in organic electroluminescent devices.

Furthermore, the invention provides an electroluminescent device comprising an anode, a cathode, and at least one electroluminescent organic layer interposed therebetween, wherein a luminescent material in the organic layer emits light upon application of a voltage between the anode and the cathode, characterized in that an auxiliary carrier transporting layer which contains an aromatic amine derivative comprising recurring units of the general formula (1) and having a number average molecular weight of 250 to 100,000, especially a soluble, electrically conductive compound in which the aromatic amine derivative forms a salt with an electron accepting dopant is formed between the anode and the organic layer.

Specifically, regarding an electroluminescent device comprising at least one electroluminescent organic layer interposed between the anode and the cathode, especially an electroluminescent device in which an organic hole transporting layer and a light emitting material layer are sequentially deposited on an inorganic electrode (ITO electrode etc.) serving as the anode and the cathode is disposed thereon, the inventors have found that the hole injection efficiency is improved by providing an auxiliary carrier transporting layer between the anode and the organic layer (especially between the inorganic electrode and the organic hole transporting layer), and forming the auxiliary carrier transporting layer mainly from the aromatic amine derivative of the general formula (1), and especially, the soluble, electrically conductive compound or polymer that the aromatic amine derivative forms with a dopant, and these means are quite effective for durability.

BEST MODE FOR CARRYING OUT THE INVENTION

Figure 1:
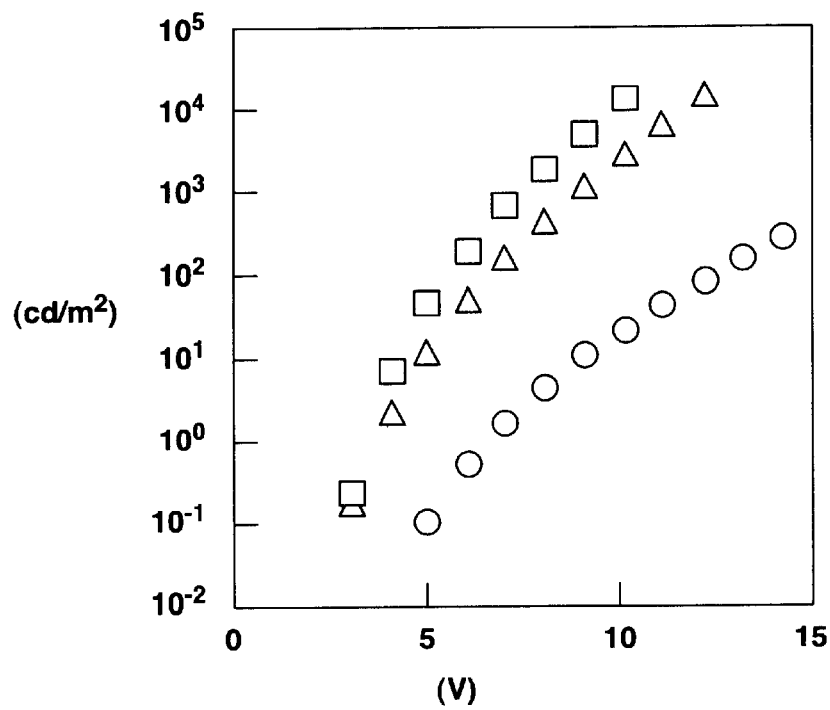
FIG. 1 is a graph showing the dependence of emission luminance on voltage of the electroluminescent device fabricated in Example 8.

The aromatic amine derivative of the invention is defined as comprising recurring units of the following general formula (1).

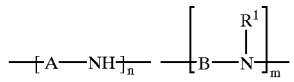

(1)

Herein $R^1$ is a substituted or unsubstituted monovalent hydrocarbon group or organooxy group; A and B each are independently a divalent group of the following general formula (2) or (3); m and n each are independently a positive number of at least 1, and the sum of m+n is 3 to 3,000.

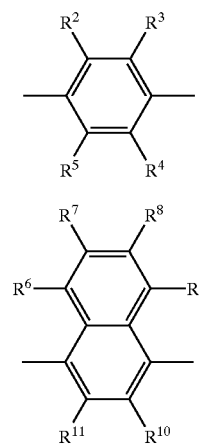

(2)

(3)

Herein $R^2$ to $R^{11}$ each are independently hydrogen, a hydroxyl group, substituted or unsubstituted monovalent hydrocarbon group, organooxy group, acyl group or sulfonate group.

In formula (1), $R^1$ is a substituted or unsubstituted monovalent hydrocarbon group or organooxy group. The monovalent hydrocarbon groups and organooxy groups are preferably of 1 to 20 carbon atoms, especially 1 to 5 carbon atoms. Examples of the monovalent hydrocarbon groups include alkyl groups such as methyl, ethyl, propyl, isopropyl, butyl, sec-butyl, tert-butyl, pentyl, hexyl, octyl and decyl; cycloalkyl groups such as cyclopentyl and cyclohexyl; bicycloalkyl groups such as bicyclohexyl; alkenyl groups such as vinyl, 1-propenyl, 2-propenyl, isopropenyl, 1-methyl-2-propenyl, 1-, 2- or 3-butenyl, and hexenyl; aryl groups such as phenyl, xylyl, tolyl, biphenyl and naphthyl; aralkyl groups such as benzyl, phenylethyl and phenylcyclohexyl; and substituted ones in which some or all of the hydrogen atoms on the foregoing monovalent hydrocarbon groups are substituted with halogen atoms, hydroxyl groups or alkoxy groups. Examples of the organooxy groups include alkoxy, alkenyloxy, and aryloxy groups, whose alkyl, alkenyl and aryl moieties are as exemplified above.

Preferably, $R^1$ is selected from among alkyl and alkoxy groups of 1 to 20 carbon atoms, more preferably 1 to 4 carbon atoms, or phenyl, cyclohexyl, cyclopentyl, biphenyl, bicyclohexyl and phenylcyclohexyl groups which may be substituted with alkyl or alkoxy groups of 1 to 4 carbon atoms, with the alkyl and alkoxy groups being especially preferred.

A and B each are independently a divalent group of the following general formula (2) or (3).

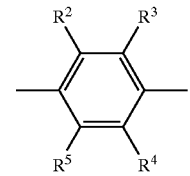
(2)

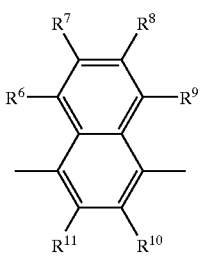
(3)

In formulae (2) and (3), $R^2$ to $R^{11}$ each are independently hydrogen, a hydroxyl group, substituted or unsubstituted monovalent hydrocarbon group, organooxy group, acyl group or sulfonate group. Examples of the substituted or unsubstituted monovalent hydrocarbon group and organooxy group are those of 1 to 20 carbon atoms as exemplified for $R^1$. The acyl groups include those of 2 to 10 carbon atoms, for example, acetyl, propionyl, butyryl, isobutyryl and benzoyl.

Preferably, $R^2$ to $R^{11}$ are selected from among hydrogen atoms, alkyl, alkoxy, alkoxyalkyl, alkenyl, acyl, sulfonate and hydroxyl groups, as well as phenyl, cyclohexyl, cyclopentyl, biphenyl, bicyclohexyl and phenylcyclohexyl groups which may be substituted with alkyl or alkoxy groups of 1 to 4 carbon atoms.

More preferably, $R^2$ to $R^{11}$ are selected from among hydrogen atoms, alkyl groups of 1 to 20 carbon atoms, alkoxy groups of 1 to 20 carbon atoms, alkoxyalkyl groups in which the alkoxy moiety has 1 to 20 carbon atoms and the alkyl moiety has 1 to 20 carbon atoms, alkenyl groups of 2 to 4 carbon atoms, acyl groups of 2 to 4 carbon atoms, benzoyl, sulfonate, and hydroxyl, as well as phenyl, cyclohexyl, cyclopentyl, biphenyl, bicyclohexyl and phenylcyclohexyl groups which may have substituents (which are alkyl groups of 1 to 4 carbon atoms or alkoxy groups of 1 to 4 carbon atoms). Even more preferably, $R^2$ to $R^{11}$ are selected from hydrogen atoms, alkyl groups of 1 to 4 carbon atoms, alkoxy groups of 1 to 4 carbon atoms, alkoxyalkyl groups in which the alkoxy moiety has 1 to 4 carbon atoms and the alkyl moiety has 1 to 4 carbon atoms, vinyl, 2-propenyl, acetyl, benzoyl, sulfonate and hydroxyl, as well as phenyl, cyclohexyl, biphenyl, bicyclohexyl and phenylcyclohexyl groups which may have substituents (which are alkyl groups of 1 to 4 carbon atoms or alkoxy groups of 1 to 4 carbon atoms).

Illustratively, the alkyl groups of 1 to 4 carbon atoms are methyl, ethyl, propyl, isopropyl, butyl, s-butyl and t-butyl, and the alkoxy groups of 1 to 4 carbon atoms are methoxy, ethoxy, propoxy, isopropoxy, butoxy, s-butoxy and t-butoxy.

$R^2$ to $R^{11}$ may be the same or different.

In formula (1), m and n each are independently a positive number of at least 1, and the sum of m+n is 3 to 3,000. The aromatic amine derivative of formula (1) has a number average molecular weight of 250 to 100,000.

Illustratively, the aromatic amine derivatives comprising recurring units of formula (1) include those comprising recurring units of the following general formulae (1a) to (1d).

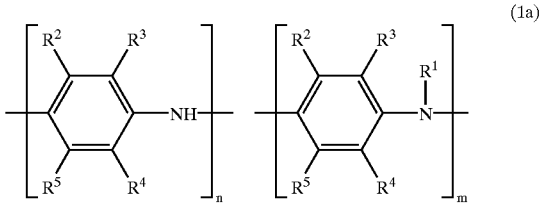
(1a)

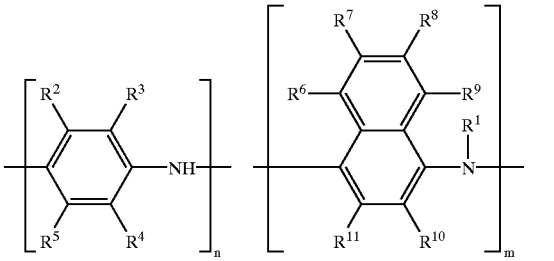
(1b)

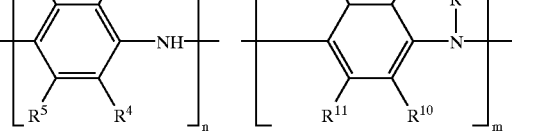

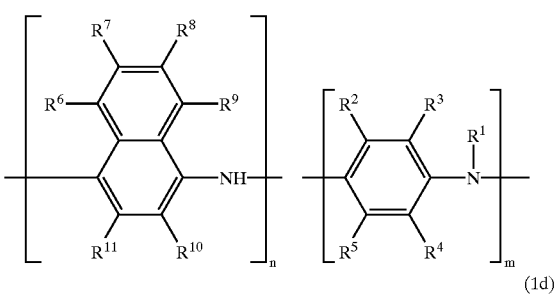
(1c)

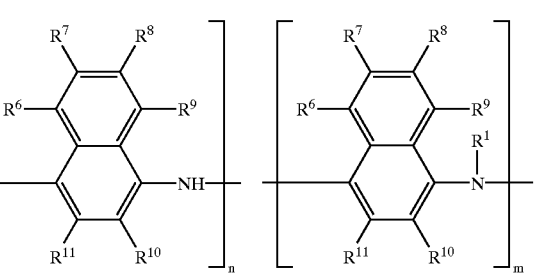
(1d)

In the formulae, $R^1$ to $R^{11}$, m and n are as defined above.

The methods of synthesizing the aromatic amine derivatives of formula (1a) and soluble conductive compounds therefrom are not critical although they can be synthesized, for example, by the following methods.

Specifically, an aniline derivative and an N-substituted aniline derivative, which are fully purified starting reactants from which antioxidants and other impurities have been removed as by distillation, are mixed and combined with an acid in a 1 to 3-fold amount based on the starting reactants to form a salt. The mixing proportion of aniline derivative and N-substituted aniline derivative is not critical although it is in the range between 1:99 and 99:1 in molar ratio.

The resulting salt, which is soluble in water, is dissolved in water in a 2 to 10-fold amount based on the starting reactants. The solution is kept at 25° C., to which ammonium persulfate, cerium sulfate, iron chloride or copper chloride is added as an oxidizing agent. The amount of the oxidizing agent added is 0.5 to 4 moles, preferably 1 to 2 moles per mole of the starting reactants. After the addition of oxidizing agent, reaction is effected for 10 to 50 hours. The reaction solution was filtered, the residue was fully washed with a low-boiling, water-soluble organic solvent such as acetone, methanol, ethanol or isopropanol, yielding a soluble conductive compound. The acid used herein becomes an electron accepting dopant for the aromatic amine derivative and is not critical. The electron accepting dopant is selected from among Lewis acids, protonic acids, transition metal compounds, electrolyte salts and halides.

Lewis acids include $FeCl_3$, $PF_5$, $AsF_5$, $SbF_5$, $BF_5$, $BCl_3$, and $BBr_3$.

Protonic acids include inorganic acids such as HF, HCl, $HNO_5$, $H_2SO_4$ and $HCl_4$, and organic acids such as benzene sulfonic acid, p-toluenesulfonic acid, dodecylbenzene-sulfonic acid, polyvinylsulfonic acid, methanesulfonic acid, 1-butanesulfonic acid, vinylphenylsulfonic acid and camphorsulfonic acid.

Transition metal compounds include FeOCl, $TiCl_4$, $ZrCl_4$, $HfCl_4$, $NbF_5$, $NbCl_5$, $TaCl_5$ and $MoF_5$.

Electrolyte salts include $LiSbF_6$, $LiAsF_6$, $NaAsF_6$, $NaSbF_6$, $KAsF_6$, $KSbF_6$, $[(n-Bu)_4N]AsF_6$, $[(n-Bu)_4N]SbF_6$, $[(n-Et)_4N]AsF_6$ and $[(n-Et)_4N]SbF_6$.

Halides includes $Cl_2$, $Br_2$, $I_2$, ICl, $ICl_3$, IBr and IF.

Of these electron accepting dopants, ferric chloride is the preferred Lewis acid, hydrochloric acid is the preferred protonic acid, perchloric acid is the preferred inorganic acid, and p-toluenesulfonic acid and camphorsulfonic acid are the preferred organic acids.

In the case of aromatic amine derivatives having no dopant, the soluble conductive compound obtained by the above method is washed with an alkali, obtaining the desired aromatic amine derivative. The alkali used herein is not critical although it is desirably ammonia or sodium hydrogen carbonate. Thus, the aromatic amine derivative of the invention is readily obtained through alkali treatment of the soluble conductive compound.

The aromatic amine derivative of the invention thus obtained can be readily converted into a soluble conductive compound or conductive high-molecular-weight compound by doping it with the above-described electron accepting dopant such as a Lewis acid, protonic acid, transition metal compound or electrolyte salt.

The dopant-forming electron acceptor is generally added in such an amount as to give one or less dopant per nitrogen atom in the recurring units of conjugated structure containing nitrogen as a basic atom.

Alternatively, doping can be carried out by forming a coating of the aromatic amine derivative of the invention and then exposing the coating to hydrochloric acid vapor or iodine vapor.

In the aromatic amine derivative of formula (1a), m and n each are independently at least 1, preferably at least 2, and more preferably at least 4, and the sum of m+n is 3 to 3,000, preferably 4 to 3,000, and more preferably 8 to 2,000. The number average molecular weight is 250 to 100,000, preferably 600 to 70,000, and more preferably 1,000 to 70,000.

The methods of synthesizing the aromatic amine derivatives of formulae (1b), (1c) and (1d) and soluble conductive compounds therefrom are the same as in the case of the aromatic amine derivatives of formula (1a). The ranges and preferred ranges of m and n are the same as in the case of the aromatic amine derivatives of formula (1a) although the aromatic amine derivatives of formulae (1b) and (1c) have a number average molecular weight of 300 to 100,000, preferably 700 to 80,000, and more preferably 1,600 to 70,000, and the derivatives of formula (1d) have a number average molecular weight of 350 to 100,000, preferably 800 to 80,000, and more preferably 1,600 to 70,000.

The soluble conductive compounds of the invention thus obtained are soluble in common organic solvents, for example, chlorinated solvents such as chloroform, dichloroethane, and chlorobenzene, amide solvents such as N,N-dimethylformamide and N,N-dimethylacetamide and polar solvents such as phenolic solvents in a proportion of 2 to 10% by weight. Of these, N,N-dimethylformamide is most desirable in order to obtain a fully stable varnish which does not gel. In this case, the solubility is usually 5 to 7% by weight.

It is noted that even a solvent which does not form a uniform medium when used alone can be used in combination with another solvent insofar as a uniform medium is obtainable. Such examples include ethyl cellosolve, butyl cellosolve, ethyl Carbitol, butyl Carbitol, ethyl Carbitol acetate and ethylene glycol.

When a coating of the soluble conductive compound is formed on a substrate, it is, of course, preferable to add additives such as coupling agents to a solution of the soluble conductive compound for the purpose of further improving the adhesion of the soluble conductive compound coating to the substrate.

The coating method of forming a thin film of the soluble conductive compound includes dipping, spin coating, transfer printing, roll coating and brush coating, but is not limited thereto. The coating thickness is not critical although a coating as thin as possible is desirable for improving external emission efficiency. Usually, a thickness of 100 to 1,000 Å is preferred.

By applying the solution onto a substrate and evaporating off the solvent, a coating of the aromatic amine derivative or conductive compound thereof according to the invention can be formed on the substrate. The temperature used in this step is sufficient for the solvent to evaporate and generally in the range of 80 to 150° C.

Next, the electroluminescent device of the invention is described.

The electroluminescent device of the invention includes an anode, a cathode and an electroluminescent organic layer therebetween.

The anode and cathode used herein may be well-known electrodes. For example, the anode may be an inorganic electrode (or transparent electrode) of ITO or the like formed on a glass substrate. The cathode may be a metallic electrode of aluminum, MgAg alloy or the like.

The electroluminescent organic layer includes a light emitting material layer and may be of well-known construction. A laminate construction in which a hole transporting layer, a light emitting material layer, and a carrier transporting layer are sequentially stacked from the cathode side is typical, though the invention is not limited thereto.

The hole transporting material is not critical although it is generally selected from tertiary aromatic amines such as N,N,N-tris(p-toluyl)amine (TPD), 1,1-bis[(di-4-toluylamine)phenyl]cyclohexane, N,N'-diphenyl-N,N'-bis (3-methylphenyl)(1,1'-biphenyl)-4,4'-diamine, N,N,N',N'-tetrakis(4-methylphenyl)(1,1'-biphenyl)-4,4'-diamine, N,N'-bis(1-naphthyl)-N,N'-diphenyl-1,1'-bisphenyl-4,4'-diamine, and 4,4',4"-tris(3-methylphenylamino)triphenylamine. Pyrazoline derivatives are also useful.

The carrier transporting material is not critical although generally aromatic fused ring compounds and metal complex compounds are often used. Examples include metal complex compounds such as tris(8-hydroxyquinoline) aluminum (Alq3) and bis(10-hydroxybenzo[h]quinolate)

beryllium (BeBq2), 1,3,4-oxathiazole derivatives, 1,2,4-triazole derivatives, bis(benzimidazole) derivatives of perylene dicarboxyimide, and thiopyrane sulfone derivatives.

Examples of the light emitting material include metal complex compounds such as Alq3 and tris(5-cyano-8-hydroxyquinoline)aluminum (Al(Q-CN)), and dyes such as oxathiazoles, e.g., biphenyl-p-(t-butyl)phenyl-1,3,4-oxathiazole, triazoles, allylenes, and coumarins though is not limited thereto.

In the electroluminescent device of the invention, an auxiliary carrier transporting layer is interposed between the anode and the organic layer, and when the organic layer includes a plurality of layers, between the anode and a layer disposed most closely thereto, typically a hole transporting layer, for assisting in charge transportation.

The auxiliary carrier transporting layer is primarily composed of the aromatic amine derivative comprising recurring units of the above general formula (1), the detail of which has been illustrated above.

It is effective to use the aromatic amine derivative in the form of a thin film of a soluble conductive compound in which the aromatic amine derivative forms a salt with an electron accepting dopant.

For improved luminance and low drive voltage, the aromatic amine derivative should preferably contain at least 50 mol % of A units in the copolymeric composition of the general formula (1).

The electroluminescent device of the invention is fabricated by any desired method. Typically, a thin film of the aromatic amine derivative or conductive compound thereof is first formed on ITO serving as an inorganic electrode. The ITO electrode used herein has been removed of foreign matter such as inorganic matter on the surface by cleaning treatment such as back sputtering or ozone treatment. The method of forming a thin film of the aromatic amine derivative or conductive compound thereof is not critical although spin coating or evaporation is preferably used. More preferably, spin coating is used.

On the electrode-bearing substrate thus obtained, electroluminescent organic materials are deposited. Their laminate structure largely varies and is not critical. Most often, a device in which a hole transporting layer, a light emitting layer and a carrier transporting layer are sequentially deposited by evaporation is used. These materials are sequentially deposited by vacuum evaporation and on the top of them, a MgAg alloy, for example, is evaporated as a cathode. This results in an electroluminescent device which emits light of a specific wavelength upon application of an electric field.

Examples and comparative examples are given below for illustrating the present invention although the invention is not limited to the examples.

EXAMPLE 1

Copolymerization of Phenetidine with N-butylaniline

To a 500-ml flask, 6.86 g (0.05 mol) of phenetidine and 7.46 g (0.05 mol) of N-butylaniline were added, and 11.0 g of hydrochloric acid was slowly added thereto. After 110 g of water was further added thereto, phenetidine and N-butylaniline hydrochloride were dissolved by gentle stirring.

After dissolution, 22.82 g (0.1 mol) of ammonium persulfate in 50 g of water was added to the solution, which was stirred for 24 hours for reaction. At the end of reaction, the reaction product was poured into 1,000 cc of acetone for washing out the unreacted reagents. The solids were collected by filtration, washed with acetone, and vacuum dried at 80° C., yielding 4.61 g of a green powder.

The soluble conductive compound thus obtained was dispersed in 300 cc of aqueous ammonia (5%). With thorough stirring, the hydrochloric acid which had been doped was removed, obtaining a compound which was an aromatic amine derivative according to the invention. The molecular weight of this compound was measured by gel permeation chromatography (GPC) on a 0.3 wt % N,N-dimethylformamide solution of the compound, finding a number average molecular weight of 12,000. On IR analysis, the compound (powder) was identified to be the end copolymer or aromatic amine derivative.

NMR analysis revealed the ratio of N-butylaniline to phenetidine to be 1:3 in the molecule. On pyrolysis gas chromatography, peaks of N-butylaniline and phenetidine were observed.

IR: 3350 cm$^{-1}$ (vNH), 1320 cm$^{-1}$ (vCN), 1220 cm$^{-1}$ (vCO), 820 cm$^{-1}$ (1,4-di-substituted benzene)

By spin coating a 5 wt % N,N-dimethylformamide solution of the powder of the copolymer having hydrochloric acid dopant, a coating was formed on a glass substrate. By the two terminal technique, surface resistivity was measured to be $3.0 \times 10^9 \Omega/\square$.

The compound from which the doping hydrochloric acid was removed was dispersed in a solution of 1 mol of ferric chloride for re-doping. For a coating of this compound formed as above, its surface resistivity was measured to be $2.35 \times 10^8 \Omega/\square$.

EXAMPLES 2, 3 AND COMPARATIVE EXAMPLES 1, 2

Copolymers having hydrochloric acid dopant were synthesized as in Example 1 while varying the molar ratio of phenetidine to N-butylaniline as shown in Table 1. The yield was determined, and the surface resistivity of a coating formed using a N,N-dimethylformamide solution of the copolymer was measured. The results are shown in Table 1 together with the results of Example 1.

TABLE 1

Synthesis and properties of phenetidine-N-butylaniline copolymers

|  | Phenetidine (mol) | N-butylaniline (mol) | Yield (g) | Surface resistivity ($\Omega/\square$) | Solubility*1 (wt %) |
|---|---|---|---|---|---|
| CE1 | 0.1 | 0 | 4.31 | $8.2 \times 10^9$ | 2 |
| E2 | 0.07 | 0.03 | 2.84 | $8.0 \times 10^8$ | 7 |
| E1 | 0.05 | 0.05 | 4.61 | $3.0 \times 10^9$ | 7 |
| E3 | 0.09 | 0.01 | 1.43 | $2.9 \times 10^{10}$ | 7 |
| CE2 | 0 | 0.1 | 7.70 | $1.2 \times 10^{10}$ | 7 |

*1the concentration used for measurement, ensuring stable dissolution without gelation.

EXAMPLE 4

Copolymerization of Phenetidine with N-ethylaniline

To a 500-ml flask, 6.86 g (0.05 mol) of phenetidine and 6.86 g (0.05 mol) of N-ethylaniline were added, and 11.0 g of hydrochloric acid was slowly added thereto. After 110 g of acetonitrile was further added thereto, phenetidine and N-ethylaniline hydrochloride were dissolved by gentle stirring.

After dissolution, 22.82 g (0.1 mol) of ammonium persulfate in 50 g of water was added to the solution, which was stirred for 40 hours for reaction. At the end of reaction, the reaction product was poured into 1,000 cc of acetone for washing out the unreacted reagents. The solids were collected by filtration and washed with acetone again. The solids were collected by filtration and vacuum dried at 80° C., yielding 6.20 g of a green powder.

The compound from which the hydrochloric acid dopant was removed was obtained as in Example 1 and measured for number average molecular weight, finding 21,000. On IR analysis, this powder was identified to be the end copolymer or aromatic amine derivative.

NMR analysis revealed the ratio of N-ethylaniline to phenetidine to be 1:3 in the molecule. On pyrolysis gas chromatography, peaks of N-ethylaniline and phenetidine were observed.

IR: 3350 cm$^{-1}$ (νNH), 1320 cm$^{-1}$ (νCN), 1220 cm$^{-1}$ (νCO), 820 cm$^{-1}$ (1,4-di-substituted benzene)

EXAMPLES 5, 6 AND COMPARATIVE EXAMPLES 3, 4

Copolymers having hydrochloric acid dopant were synthesized as in Example 1 while varying the molar ratio of phenetidine to N-ethylaniline as shown in Table 2. The yield was determined, and the surface resistivity of a film formed using a N,N-dimethylformamide solution of the copolymer was measured. The results are shown in Table 2 together with the results of Example 4.

TABLE 2

Synthesis and properties of phenetidine-N-ethylaniline copolymers

|     | Phenetidine (mol) | N-ethylaniline (mol) | Yield (g) | Surface resistivity (Ω/□) | Solubility (wt %) |
| --- | --- | --- | --- | --- | --- |
| CE3 | 0.1  | 0    | 5.20 | $7.0 \times 10^{7}$  | 2 |
| E5  | 0.07 | 0.03 | 4.10 | $3.52 \times 10^{8}$ | 5 |
| E4  | 0.05 | 0.05 | 6.20 | $5.12 \times 10^{8}$ | 5 |
| E6  | 0.09 | 0.01 | 3.95 | $8.88 \times 10^{8}$ | 5 |
| CE4 | 0    | 0.1  | 4.27 | $8.31 \times 10^{10}$ | 5 |

EXAMPLE 7

Copolymerization of Phenetidine with N-butylaniline

To a 500-ml flask, 6.86 g (0.05 mol) of phenetidine and 7.46 g (0.05 mol) of N-butylaniline were added, and 11.0 g of hydrochloric acid was slowly added thereto. After 300 g of water was further added thereto, phenetidine and N-butylaniline hydrochloride were dissolved by gentle stirring.

After dissolution, 22.82 g (0.1 mol) of ammonium persulfate in 50 g of water was added to the solution, which was stirred at a reaction temperature of 35° C. for 12 hours for reaction. At the end of reaction, the reaction product was poured into 1,000 cc of acetone for washing out the unreacted reagents. The solids were collected by filtration and washed with acetone. The solids were collected by filtration and vacuum dried at 80° C., yielding 3.38 g of a green powder.

By IR and FDMASS, the compound thus obtained was identified to be a copolymer compound of oligomers in which n+m was 4, 5, 6, 7 and 8 which were terminated at both ends with N-butylaniline.

IR: 3350 cm$^{-1}$ (νNH), 1320 cm$^{-1}$ (νCN), 1220 cm$^{-1}$ (νCO), 820 cm$^{-1}$ (1,4-di-substituted benzene)

EXAMPLE 8

To 0.09 mol (13.48 g) of N-butylaniline and 0.01 mol (1.38 g) of o-phenetidine was added 25.71 g (0.25 mol) of 35% hydrochloric acid. Then 200 ml of water was poured to the solution, which was stirred at the boiling point for 2 hours. Thereafter, the solution was cooled to 30° C., to which a solution of 0.2 mol ammonium persulfate in 100 ml water was added dropwise at a reaction temperature of 30 to 32° C. After the completion of dropwise addition, stirring was continued for a further 24 hours at a reaction temperature of 30 to 32° C. At the end of reaction, the product was poured into a large volume of acetone, washed and filtered. This operation was repeated until the filtrate became colorless.

The compound thus obtained was identified by GPC and IR to be the end product.

IR: 3350 cm$^{-1}$ (νNH), 1320 cm$^{-1}$ (νCN), 1220 cm$^{-1}$ (νCO), 820 cm$^{-1}$ (1,4-substituted benzene)

GPC: number average molecular weight 2,655
polydispersity index (Mw/Mn) 58.40
(measurement conditions: eluent DMF, flow rate 1.0 ml/min, polystyrene basis, column KD805 by Showa Denko Co., Ltd.)

By NMR, the copolymer ratio was determined to be 9:1, which substantially corresponded to the mixing ratio.

The resulting compound, 2 g, was dissolved in 98 g of N,N-dimethylformamide solvent, to which 2.99 g of 5-sulfosalicylic acid was added as a dopant, followed by stirring for one day at room temperature. The varnish thus obtained was passed through a 0.2-micron filter to remove the insoluble.

An electroluminescent device was fabricated as follows under such conditions that a thin film was formed from the varnish to a thickness of 100 Å by a spin coating technique.

ITO-deposited glass had an ITO thickness of 1000 Å. This substrate was subjected to ultrasonic cleaning with acetone and isopropyl alcohol and then to ozone treatment. To the thus treated substrate, the varnish was spin coated to form a thin film of 100 Å thick. On the substrate, TPD, Alq, and MgAg were formed by vacuum evaporation to a thickness of 400 Å, 600 Å, and 2000 Å, respectively.

The thus fabricated device was measured for light emission performance by applying a voltage. FIG. 1 illustrates the dependence of emission luminance on voltage, and FIG. 2 illustrates the voltage versus current density.

Figure 2:
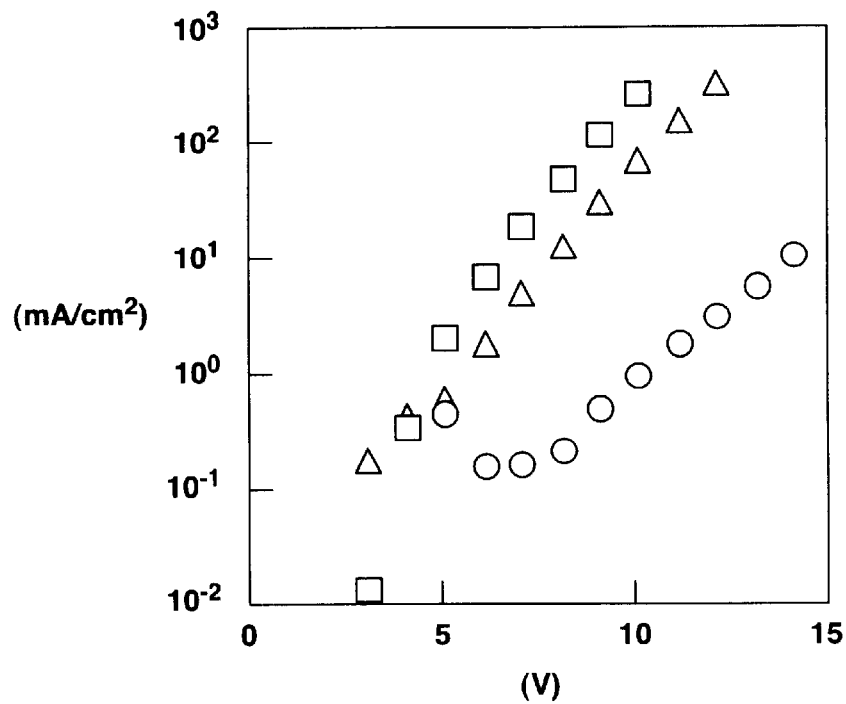
FIG. 2 is a graph showing the dependence of current density on voltage of the electroluminescent device fabricated in Example 8.

In the diagrams of FIGS. 1 and 2, while circle (○) and white square (□) symbols represent the results of electroluminescent devices of cathode/auxiliary carrier transporting layer/hole transporting layer/light emitting material layer/anode construction, and white triangle (Δ) symbols represent the results of an electroluminescent device of cathode/hole transporting layer/light emitting material layer/anode construction. The respective layers were composed of the following components.

Cathode: indium tin oxide
Auxiliary carrier transporting layer:
  Ω: the above copolymer/5-sulfosalicylic acid=1/1
  □: the above copolymer/5-sulfosalicylic acid=1/2
Hole transporting layer:
  N,N'-diphenyl-N,N'-bis(3-methylphenyl)(1,1'-bisphenyl)-4,4'-diamine
Light emitting material layer:
  aluminum 8-hydroquinoline complex
Anode: magnesium-silver alloy

EXAMPLES 9–11

As in Example 8, polymerization was carried out while varying the mixing ratio of N-butylaniline to o-phenetidine;

DMF varnishes of the copolymers were prepared; and electroluminescent devices were fabricated and evaluated for performance. Experimental conditions and molecular weight are shown in Table 3. The dopant used was 5-sulfosalicylic acid.

The characteristics of the electroluminescent devices are shown in Table 4.

TABLE 3

Experimental conditions and molecular weight

| Example | Monomer ratio*1 | Solvent | Number average molecular weight (Mn) | Polydispersity index (Mw/Mn) |
|---|---|---|---|---|
| 8 | 9:1 | water | 2655 | 58.40 |
| 9 | 7:3 | water | 1713 | 8.35 |
| 10 | 5:5 | water | 1109 | 9.80 |
| 11 | 3:7 | water | 1020 | 9.61 |

*1N-butylaniline/o-phenetidine

TABLE 4

Characteristics of electroluminescent devices having conductive compound in auxiliary charge layer

| Example | Monomer ratio*1 | Solvent | Solids (%) | Maximum luminance (cd/m$^2$) | Voltage (V) |
|---|---|---|---|---|---|
| 8 | 9:1 | DMF | 1.09 | 4000 | 19 |
| 9 | 7:3 | DMF | 1.12 | 3000 | 18 |
| 10 | 5:5 | DMF | 1.15 | 3500 | 14 |
| 11 | 3:7 | DMF | 1.18 | 7000 | 14 |

*1N-butylaniline/o-phenetidine

EXAMPLES 12–16

As in Example 8, polymerization was carried out while varying the mixing ratio of N-butylaniline to o-phenetidine; DMF varnishes of the copolymers were prepared; and electroluminescent devices were fabricated and evaluated for performance. The dopant used was hydrochloric acid.

The characteristics of the electroluminescent devices are shown in Table 5.

TABLE 5

Characteristics of electroluminescent devices having conductive compound in auxiliary charge layer

| Example | Monomer ratio*1 | Solvent | Solids (%) | Maximum luminance (cd/m$^2$) | Voltage (V) |
|---|---|---|---|---|---|
| 12 | 9:1 | DMF | 2.22 | 3500 | 21 |
| 13 | 7:3 | DMF | 1.68 | 4000 | 21 |
| 14 | 5:5 | DMF | 1.25 | 6000 | 19 |
| 15 | 3:7 | DMF | 1.21 | 4000 | 18 |
| 16 | 1:9 | DMF | 1.00 | 4500 | 18 |

*1N-butylaniline/o-phenetidine

COMPARATIVE EXAMPLE 5

To 0.2 mol (18.6 g) of aniline was added 30.86 g (0.3 mol) of 35% hydrochloric acid. Then 200 ml of water was poured to the solution, which was stirred at the boiling point for 2 hours. Thereafter, the solution was cooled to 5° C., to which a solution of 0.2 mol ammonium persulfate in 100 ml water was added dropwise at a reaction temperature of 0 to 50° C. After the completion of dropwise addition, stirring was continued for a further 24 hours at a reaction temperature of 0 to 5° C. At the end of reaction, the product was poured into a large volume of acetone, washed and filtered. This operation was repeated until the filtrate became colorless.

The compound thus obtained was identified by GPC and IR to be the end product.

IR: 3350 cm$^{-1}$ (vNH), 1320 cm$^{-1}$ (vCN), 1220 cm$^{-1}$ (vCO), 820 cm$^{-1}$ (1,4-substituted benzene)

GPC: number average molecular weight 8,650
polydispersity index (Mw/Mn) 6.55
(measurement conditions: eluent DMF, flow rate 1.0 ml/min, polystyrene basis, column KD805 by Showa Denko Co., Ltd.)

The resulting compound, 2 g, was dissolved in 98 g of N,N-dimethylformamide solvent, to which 0.015 mol (3.27 g) of 5-sulfosalicylic acid was added as a dopant, followed by stirring for one day at room temperature. An attempt was made to pass the varnish thus obtained through a 0.2-micron filter to remove the insoluble, but failed. A thin film was formed using the non-filtered varnish, finding asperities in excess of 2000 Å.

Using the varnish, an electroluminescent device was fabricated. Electrical shorts due to asperities in excess of 2000 Å prevented evaluation of its performance.

Examples 8 to 16 used an auxiliary carrier transporting layer material having ease of coating and suited for electroluminescent devices, from which efficient and consistent fabrication of electroluminescent devices was confirmed.

What is claimed is:

1. An aromatic amine derivative comprising recurring units of the following general formula (1) and having a number average molecular weight of 250 to 100,000,

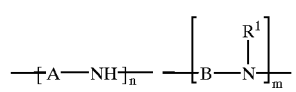

(1)

wherein R$^1$ is a substituted or unsubstituted monovalent hydrocarbon group or organooxy group, A and B each are independently a divalent group of the following general formula (2) or (3):

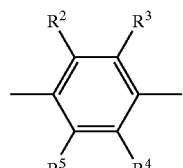

(2)

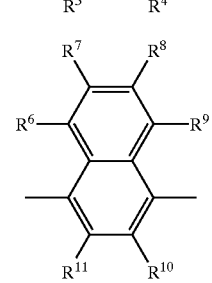

(3)

wherein R$^2$ to R$^{11}$ each are independently hydrogen, a hydroxyl group, substituted or unsubstituted monovalent hydrocarbon group, organooxy group, acyl group or sulfonate group, m and n each are independently a positive number of at least 1, and the sum of m+n is 3 to 3,000.

2. The aromatic amine derivative of claim 1 which is represented by the following general formula (1a) and has a number average molecular weight of 250 to 100,000,

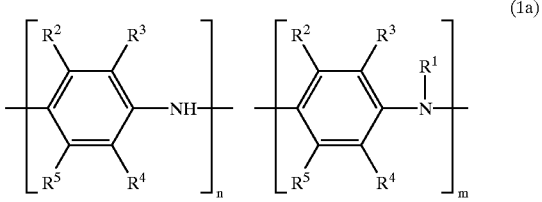

(1a)

wherein $R^1$ to $R^5$, m and n are as defined above.

3. The aromatic amine derivative of claim 2 wherein $R^1$ is an alkyl group having 1 to 20 carbon atoms or alkoxy group having 1 to 20 carbon atoms.

4. The aromatic amine derivative of claim 2 or 3 wherein $R^2$ to $R^5$ are independently selected from the class consisting of a hydrogen atom, an alkyl group having 1 to 20 carbon atoms, an alkoxy group having 1 to 20 carbon atoms, an alkoxyalkyl group in which the alkoxy moiety has 1 to 20 carbon atoms and the alkyl moiety has 1 to 20 carbon atoms, an alkenyl group having 2 to 4 carbon atoms, an acyl group having 2 to 4 carbon atoms, a benzoyl group, a sulfonate group, a hydroxyl group, and a phenyl, cyclohexyl, cyclopentyl, biphenyl, bicyclohexyl and phenylcyclohexyl group which may be substituted with an alkyl group of 1 to 4 carbon atoms or alkoxy group of 1 to 4 carbon atoms.

5. The aromatic amine derivative of claim 1 which is represented by the following general formula (1b) or (1c) and has a number average molecular weight of 300 to 100,000,

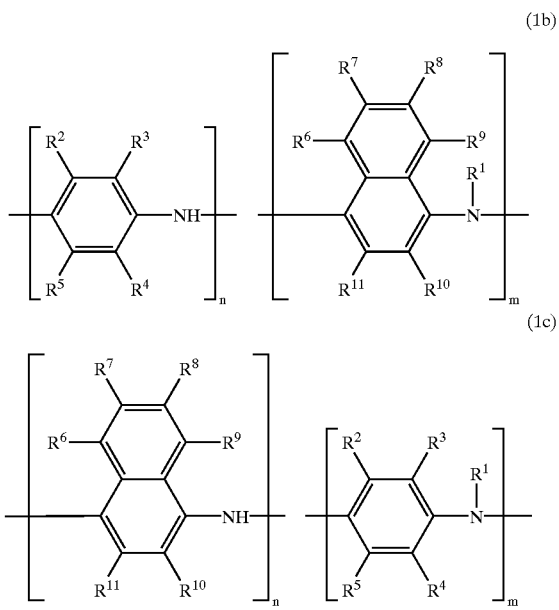

(1b)

(1c)

wherein $R^1$ to $R^{11}$, m and n are as defined above.

6. The aromatic amine derivative of claim 5 wherein $R^1$ is an alkyl group having 1 to 20 carbon atoms or alkoxy group having 1 to 20 carbon atoms.

7. The aromatic amine derivative of claim 5 or 6 wherein $R^2$ to $R^{11}$ are independently selected from the class consisting of a hydrogen atom, an alkyl group having 1 to 20 carbon atoms, an alkoxy group having 1 to 20 carbon atoms, an alkoxyalkyl group in which the alkoxy moiety has 1 to 20 carbon atoms and the alkyl moiety has 1 to 20 carbon atoms, an alkenyl group having 2 to 4 carbon atoms, an acyl group having 2 to 4 carbon atoms, a benzoyl group, a sulfonate group, a hydroxyl group, and a phenyl, cyclohexyl, cyclopentyl, biphenyl, bicyclohexyl and phenylcyclohexyl group which may be substituted with an alkyl group of 1 to 4 carbon atoms or alkoxy group of 1 to 4 carbon atoms.

8. The aromatic amine derivative of claim 1 which is represented by the following general formula (1d) and has a number average molecular weight of 350 to 100,000,

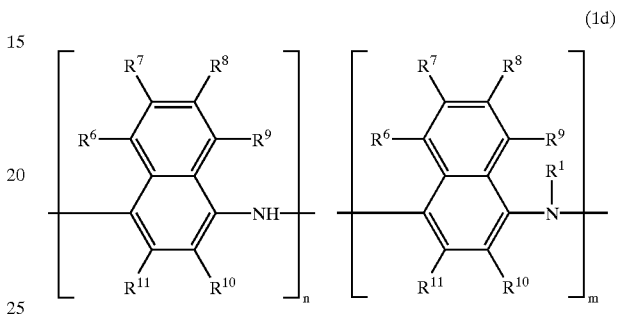

(1d)

wherein $R^1$, $R^6$ to $R^{11}$, m and n are as defined above.

9. The aromatic amine derivative of claim 8 wherein $R^1$ is an alkyl group having 1 to 20 carbon atoms or alkoxy group having 1 to 20 carbon atoms.

10. The aromatic amine derivative of claim 8 or 9 wherein $R^6$ to $R^{11}$ are independently selected from the class consisting of a hydrogen atom, an alkyl group having 1 to 20 carbon atoms, an alkoxy group having 1 to 20 carbon atoms, an alkoxyalkyl group in which the alkoxy moiety has 1 to 20 carbon atoms and the alkyl moiety has 1 to 20 carbon atoms, an alkenyl group having 2 to 4 carbon atoms, an acyl group having 2 to 4 carbon atoms, a benzoyl group, a sulfonate group, a hydroxyl group, and a phenyl, cyclohexyl, cyclopentyl, biphenyl, bicyclohexyl and phenylcyclohexyl group which may be substituted with an alkyl group of 1 to 4 carbon atoms or alkoxy group of 1 to 4 carbon atoms.

11. A soluble, electrically conductive compound in which the aromatic amine derivative of claim 1 or 2 forms a salt with an electron accepting dopant.

12. The soluble, electrically conductive compound of claim 11 wherein the electron accepting dopant is selected from the group consisting of a Lewis acid, protonic acid, transition metal compound, electrolyte salt and halide.

13. An electroluminescent device comprising an anode, a cathode, and at least one electroluminescent organic layer interposed therebetween, wherein a luminescent material in said organic layer emits light upon application of a voltage between the anode and the cathode, and wherein an auxiliary carrier transporting layer which contains an aromatic amine derivative comprising recurring units of the following general formula (1) and having a number average molecular weight of 250 to 100,000 is formed between said anode and said organic layer

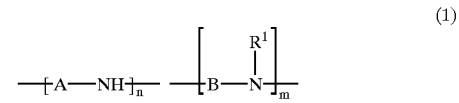

(1)

wherein $R^1$ is a substituted or unsubstituted monovalent hydrocarbon group or organooxy group, A and B each are independently a divalent group of the following general formula (2) or (3):

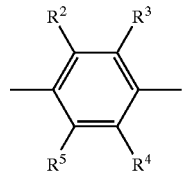
(2)

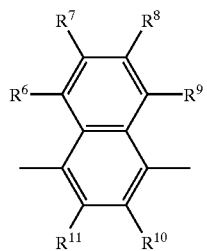
(3)

wherein $R^2$ to $R^{11}$ each are independently hydrogen, a hydroxyl group, substituted or unsubstituted monovalent hydrocarbon group, organooxy group, acyl group or sulfonate group, m and n each are independently a positive number of at least 1, and the sum of m+n is 3 to 3,000.

14. The electroluminescent device of claim 13 wherein the aromatic amine derivative has the following general formula (1a) to (1d):

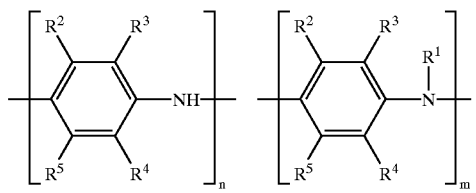
(1a)

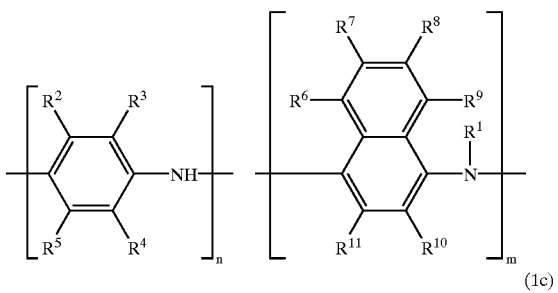
(1b)

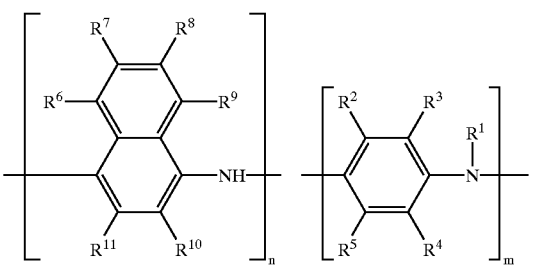
(1c)

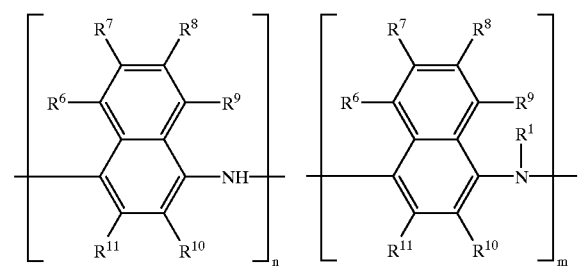
(1d)

wherein $R^1$ to $R^{11}$, m and n are as defined above.

15. The electroluminescent device of claim 13 or 14 wherein said auxiliary carrier transporting layer is formed of a soluble, electrically conductive compound in which said aromatic amine derivative forms a salt with an electron accepting dopant.

16. The electroluminescent device of claim 15 wherein the electron accepting dopant is selected from the group consisting of a Lewis acid, protonic acid, transition metal compound, electrolyte salt and halide.

* * * * *

UNITED STATES PATENT AND TRADEMARK OFFICE
CERTIFICATE OF CORRECTION

PATENT NO.    : 6,632,544 B1
DATED         : October 14, 2003
INVENTOR(S)   : Kido, Junji et al.

It is certified that error appears in the above-identified patent and that said Letters Patent is hereby corrected as shown below:

<u>Title page,</u>
Item [75], Inventors, please change,
"Junji Kido, 4-3, Umamikita 9-chrome Kitakatsuragi-gun, Koryo-cho, Nara, 635-0831 (JP)"
to
-- Junji Kido, 4-3, Umamikita 9-chome Kitakatsuragi-gun, Koryo-cho, Nara 635-0831 (JP) --

Signed and Sealed this

Twenty-second Day of June, 2004

JON W. DUDAS
*Acting Director of the United States Patent and Trademark Office*